United States Patent
Varma et al.

(10) Patent No.: US 12,320,850 B2
(45) Date of Patent: Jun. 3, 2025

(54) DYNAMIC VOLTAGE FREQUENCY SCALING TO REDUCE TEST TIME

(71) Applicant: MEDIATEK INC., Hsinchu (TW)

(72) Inventors: Anshul Varma, San Jose, CA (US); Hsin Chen Chen, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/244,994

(22) Filed: Sep. 12, 2023

(65) Prior Publication Data

US 2024/0110979 A1   Apr. 4, 2024

Related U.S. Application Data

(60) Provisional application No. 63/377,548, filed on Sep. 29, 2022.

(51) Int. Cl.
  *G01R 31/3185* (2006.01)
  *G01R 31/3177* (2006.01)

(52) U.S. Cl.
  CPC . *G01R 31/318547* (2013.01); *G01R 31/3177* (2013.01); *G01R 31/318536* (2013.01); *G01R 31/318552* (2013.01)

(58) Field of Classification Search
  CPC .... G01R 31/318547; G01R 31/318536; G01R 31/318552; G01R 31/3177
  See application file for complete search history.

(56) References Cited

U.S. PATENT DOCUMENTS

| | | | | |
|---|---|---|---|---|
| 7,272,523 B1* | 9/2007 | John | ...................... | H01L 22/14 257/E21.531 |
| 9,081,063 B2* | 7/2015 | Narayanan | ..... | G01R 31/318516 |
| 2007/0203661 A1* | 8/2007 | John | ...................... | H01L 22/14 257/E21.531 |
| 2012/0126781 A1* | 5/2012 | Narayanan | ..... | G01R 31/318516 324/76.11 |
| 2015/0198665 A1* | 7/2015 | Srinivasan | ....... | G01R 31/31727 714/731 |
| 2018/0203065 A1* | 7/2018 | Dani | .............. | G01R 31/318552 |
| 2023/0146920 A1* | 5/2023 | Bhaskaran | ............. | G01R 29/26 702/69 |

* cited by examiner

*Primary Examiner* — Samir W Rizk

(74) *Attorney, Agent, or Firm* — Troutman Pepper Locke LLP; Tim Tingkang Xia, Esq.

(57) ABSTRACT

In an aspect of the disclosure, a method, a computer-readable medium, and an apparatus are provided. The apparatus is used for performing a scan test on a chip. In certain configurations, the apparatus includes an internal voltage source on a same die of the chip. The internal voltage source receives a constant voltage. The internal voltage source generates an internal voltage based on the constant voltage. The internal voltage is maintained at a lower voltage level in a capture phase of the scan test, and is increased from the lower voltage level to a high voltage level at a start of a shift phase of the scan test and reduced from the high voltage level to the lower voltage level at an end of the shift phase.

17 Claims, 6 Drawing Sheets

DYNAMIC VOLTAGE FREQUENCY SCALING TO REDUCE TEST TIME

CROSS-REFERENCE TO RELATED APPLICATION(S)

This application claims the benefits of U.S. Provisional Application Ser. No. 63/377,548, entitled "DYNAMIC VOLTAGE FREQUENCY SCALING TO REDUCE TEST TIME" and filed on Sep. 29, 2022, which is expressly incorporated by reference herein in their entirety.

BACKGROUND

Field

The present disclosure relates generally to chip testing, and more particularly, to techniques of methods and apparatuses about dynamic voltage frequency scaling (DVFS) to reduce test time.

Background

The statements in this section merely provide background information related to the present disclosure and may not constitute prior art.

Logic devices are electronic components formed by electronic circuits, such as resistors, transistors, capacitors, inductors and diodes. In some cases, the logic device may be in the form of a computer chip, which is a hardware electronic component such as an integrated circuit (IC) or a combination of electronic circuits or ICs. As logic devices become more complex, it took increasing amounts of time and effort to create and validate tests applied to the logic devices. Currently, the industry moves to a design for test approach where the design was modified such that it is easier to perform the testing. The approach is called a structural test or a scan test, as it involves scanning test patterns into the internal circuits within the device under test (DUT).

Scan test is a common structural test technique on each chip before shipping to the customer to check for any manufacturing defects. The scan test consumes roughly 15% of the total test time, and is a prohibitive cost that is incurred for every single part shipped. Specifically, the flip-flops of the design are modified to function as stimulus and observation points, or "scan cells" during test, while performing their intended functional role during normal operation. In the scan test, the scan flip-flops are stitched together into scan chains using conventional electronic design automation (EDA) tools available. In particular, the scan chains operate like big shift registers when the circuit is put into the test mode, and are used by an external automatic test equipment (ATE) to deliver or "shift" test pattern data into the DUT. In other words, the data is shifted in through the scan chains. After the test pattern is loaded, the design is placed back into functional mode and the test response is captured in one or more clock cycles, and the data is shifted out, such that the ATE may compare the response data with expected data for a chip with no defects. Any difference or mismatch in the comparison indicates a faulty chip with defects. This shift-in and shift-out process repeats several times to increase coverage of the DUT. Further, this process is repeated for different voltages for a thorough check that the chip works as expected under various operating conditions.

In the typical scan test, a typical scan chain load in the shift phase takes hundreds of clock cycles, while the response captured in the capture phase only takes 2 cycles. Hence, the test time of the scan test is dominated by shift time, which is directly related to shift clock speed. A higher shift clock speed is desirable since it provides lesser test time. However, with the process being repeatedly performed for different voltages, the shift time may be affected by the actual voltage level being used, where a lower voltage level would result in longer shift time.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus is used for performing a scan test on a chip. In certain configurations, the apparatus includes an internal voltage source on a same die of the chip. The apparatus receives a constant voltage at the internal voltage source. The apparatus generates, at the internal voltage source, an internal voltage based on the constant voltage. The internal voltage is maintained at a lower voltage level in a capture phase of the scan test, and is increased from the lower voltage level to a high voltage level at a start of a shift phase of the scan test and reduced from the high voltage level to the lower voltage level at an end of the shift phase. The apparatus shifts-in scan data patterns to the chip in the shift phase at the internal voltage. The apparatus captures response data from the chip in the capture phase at the internal voltage.

In certain configurations, the apparatus further includes an on-chip clock controller. The on-chip clock controller is configured to generate a scan clock signal for shifting-in scan data patterns to the chip in the shift phase and capturing response data from the chip in the capture phase. A frequency of the scan clock signal at the start and the end of the shift phase is adjusted to be scaled with the internal voltage.

In certain configurations, the apparatus further includes an on-die shift ring oscillator (ROSC) and an on-die capture ROSC. The on-die shift ROSC is configured to generate a shift clock signal and to adjust a frequency of the shift clock signal to be scaled with the internal voltage. The on-die capture ROSC is configured to generate a capture clock signal. The on-chip clock controller is configured to generate the scan clock signal from the shift clock signal and the capture clock signal.

In certain configurations, the apparatus further includes a voltage control module. The voltage control module is configured to receive a scan enable signal from the on-chip clock controller and to generate a control signal for controlling the internal voltage source to generate the internal voltage from the constant voltage. The on-chip clock controller is configured to generate the scan enable signal for enabling the shift clock signal as the scan clock signal in the shift phase and enabling the capture clock signal as the scan clock signal in the capture phase.

In certain configurations, the apparatus further includes a scan-in buffer and a scan out buffer. The scan-in buffer is configured to shift-in scan data patterns to the chip in the shift phase. The scan-out buffer is configured to store response data captured and shifted-out from the chip in the capture phase.

In certain configurations, the apparatus further includes an on-die pseudo-random test pattern generator (PRPG) and an on-die multiple input signature register (MISR). The on-die PRPG is configured to shift-in scan data patterns to the chip in the shift phase. The on-die MISR is configured to store response data captured and shifted-out from the chip in the capture phase.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
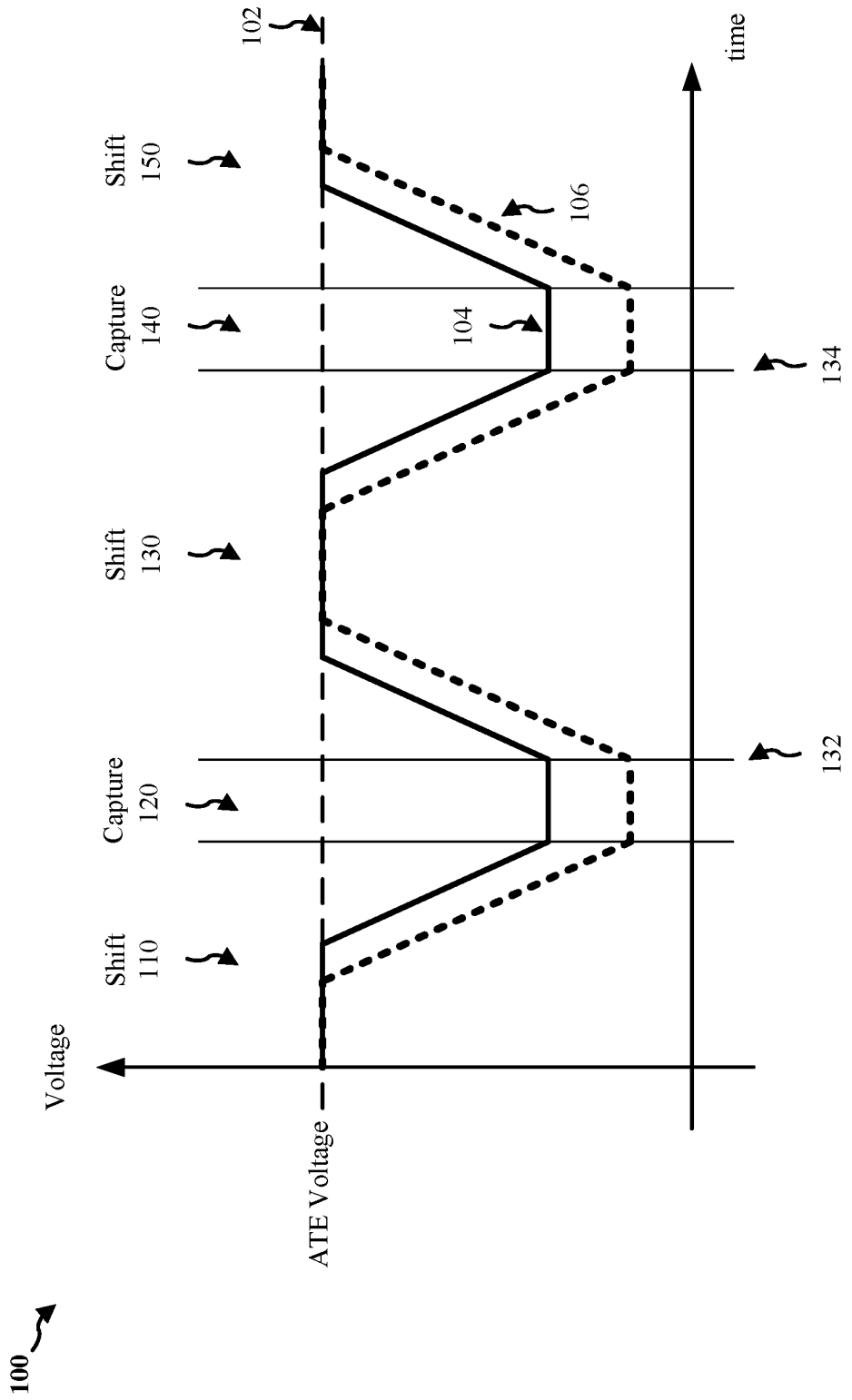
FIG. 1 is a diagram illustrating an example of dynamic voltage and frequency scaling for scan shift clock.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunications systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

As discussed, the test time of the scan test is dominated by shift time, and with the process being repeatedly performed for different voltages, the shift time may be affected by the actual voltage level being used, where a lower voltage level would result in longer shift time. Therefore, certain aspects of the present invention relate to methods and apparatuses about dynamic voltage frequency scaling for scan shift clock to reduce the total test time.

FIG. 1 is a diagram illustrating an example of dynamic voltage and frequency scaling for scan shift clock. As shown in FIG. 1, a scan test 100 includes a plurality of shift phases 110, 130, 150 and capture phases 120 and 140, and an ATE voltage is fixed at a high voltage level. Specifically, the ATE voltage may be provided by an ATE, which functions as a power supply for the scan test. In comparison, the internal voltage, which is a regulated voltage being applied to the DUT, may be variable. In the case where the scan test is performed at the high voltage level (i.e., the ATE voltage 102), the internal voltage 102 maintains at the ATE voltage. However, when the scan test is intended to be performed at a lower voltage level (e.g., the reduced voltage levels 104 and 106), the internal voltage may be variable through the dynamic voltage and frequency scaling process, such that it is reduced to the desired lower voltage level in the capture phases 120 and 140.

Using the shift phase 130 as an example, for the internal voltage to maintain at the lower voltage level in each of the capture phases 120 and 140, the internal voltage is increased from the lower voltage level (i.e., the voltage level for the capture phase 120) to the high voltage level (i.e., the fixed voltage level of the ATE voltage 102) at a start 132 of the shift phase 130, and is reduced from the high voltage level to the lower voltage level (i.e., the voltage level for the capture phase 120) at an end 134 of the shift phase 130. In other words, during the shift phase 130, the internal voltage is increased to the high voltage level within a shorter amount of time after the capture phase 120 and maintained at the high voltage level for most of the shift phase 130, and then is reduced to the desired lower voltage level right before the capture phase 140. Thus, the capture phases 120 and 140 are still done at the requisite lower test voltage level, while the average voltage level of the internal voltage available during the shift phase 130 is still much higher than the requisite lower voltage level. Accordingly, higher shift speeds are possible with this approach which reduce the overall test time.

Typically, voltage transition slew rates on the ATE may be greater than 25 mV per μs. Thus, a typical scan chain of length of 250 with a shift clock speed of 100 MHz may take 2.5 μs to load/unload. Thus, in a hypothetical case where the ATE voltage is to be varied without using an internal voltage as the regulated voltage for the DUT, it cannot achieve much voltage gain. In other words, changing the ATE voltage may take too much time. Thus, an internal on-die voltage source may be used for performing the voltage variation (or more specifically, reducing the voltage from the high voltage level to the desired lower voltage level right before the capture stage, and increase the voltage level back to the high voltage level within a shorter amount of time after the capture stage). In certain configurations, the on-die voltage source may be, without being limited thereto, an internal low dropout (iLDO) voltage regulator. Specifically, the internal on-die voltage source may offer high voltage change slew rates with minimal power dissipation across it. Slew rates 10 to 15 times faster than ATE are possible with the on-die voltage source.

As the internal voltage is scaled up and down in the shift phases, the scan shift frequency should be varied or adjusted accordingly to get the benefit from this scheme. Thus, an on-die ring oscillator (ROSC) based scan shift clock may be used, in which the on-die ROSC functions as an on-chip clock controller (OCC). As the internal voltage is scaled, the delay of the ring oscillator varies accordingly which in turn will vary the output clock frequency.

Figure 2:
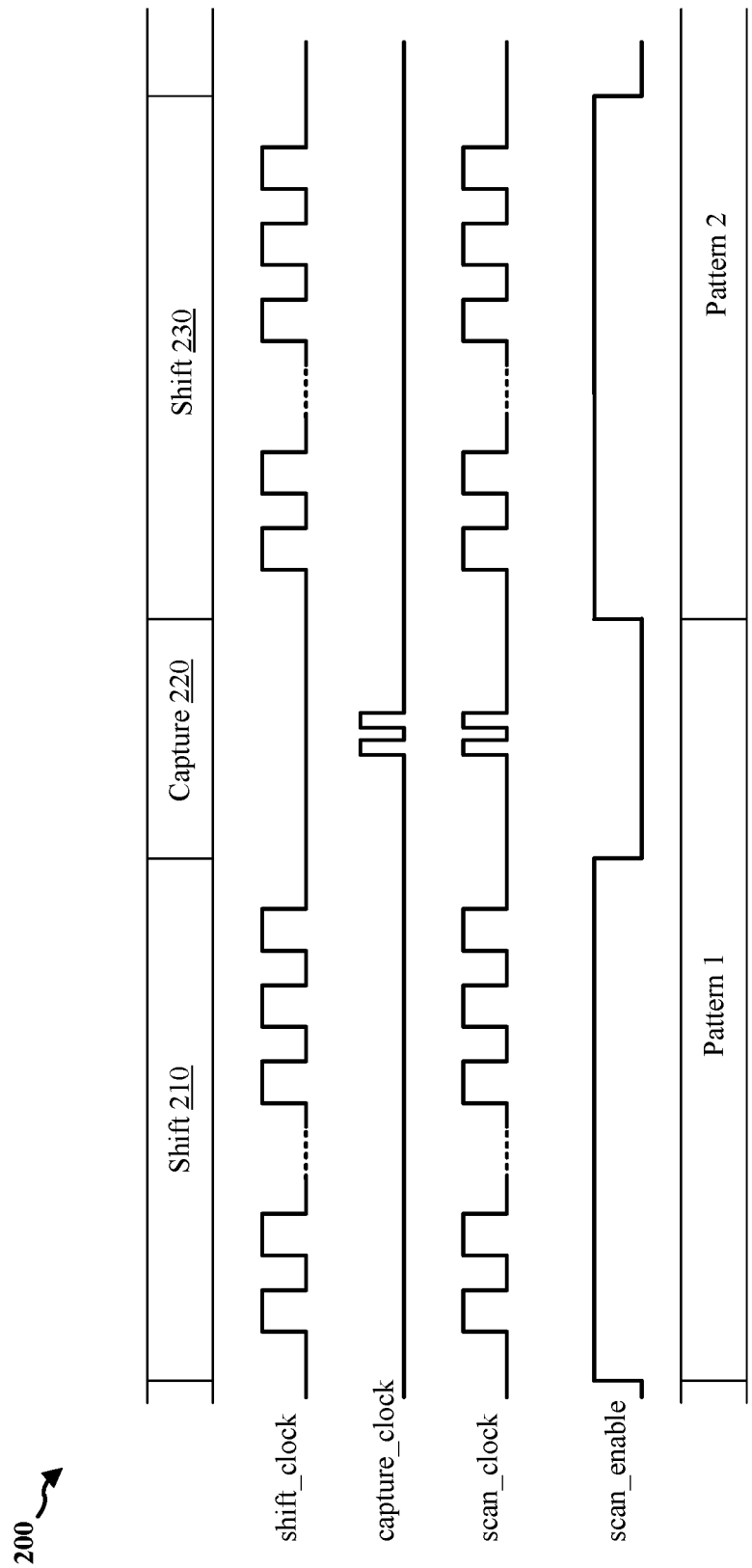
FIG. 2 is a diagram illustrating an example of the scan clock and scan enable signals for a scan test performed at a constant voltage level.

FIG. 2 is a diagram illustrating an example of the scan shift clock and shift enable signals for a scan test performed at a constant voltage level. For a scan test performed at the constant voltage level, the scan clock signal scan_clock in each of the shift phases 210 and 230 may include hundreds of scan_clock cycles, while the response captured in the capture phase 220 only takes 2 cycles. FIG. 2 also shows that the shift phases 210 and 230 run at a slow shift clock, while the capture phase 220 runs at a fast capture clock. Specifically, the scan clock signal may be a combination of a shift clock signal and a capture clock signal, and the scan enable signal scan_enable maintains at a higher voltage level in the shift phases 210 and 230 and at a lower voltage level in the capture phase 220, such that a clock controller may generate the scan clock signal based on the shift clock signal and the capture clock signal.

Figure 3:
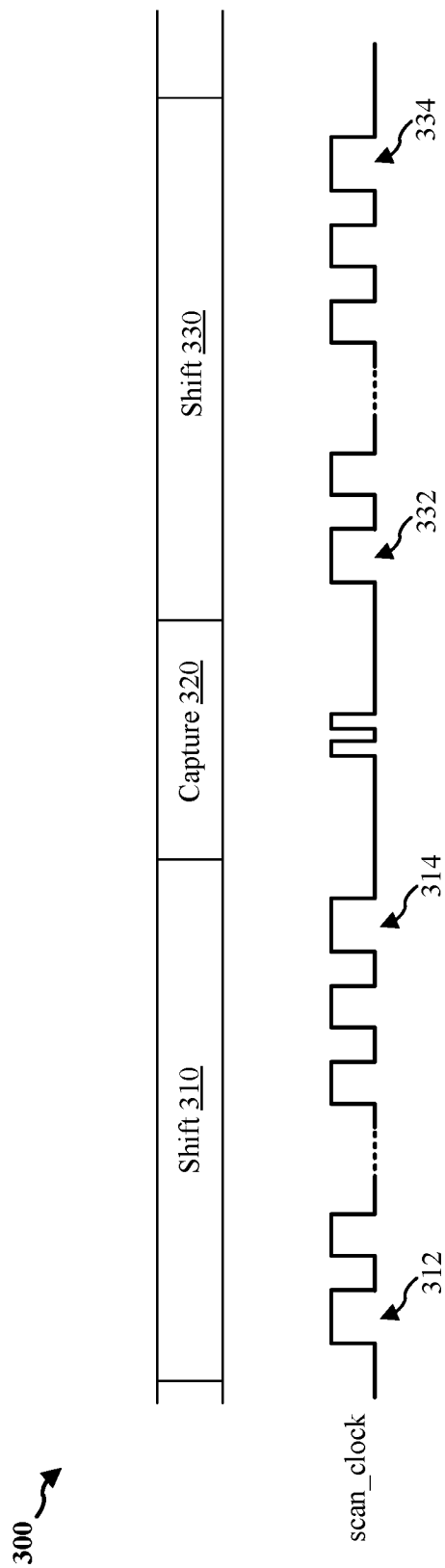
FIG. 3 is a diagram illustrating an example of the scan clock signal for a scan test performed at the DVFS reduced voltage level.

FIG. 3 is a diagram illustrating an example of the scan shift clock and shift enable signals for a scan test performed at the DVFS reduced voltage level. When the scan test is performed at the DVFS reduced voltage level, due to the adjustment to the frequency of the scan clock signal (or more precisely, the frequency of the shift clock signal) at the start 312 and the end 314 of the shift phase 310 or at the start 332 and the end 334 of the shift phase 330, the scan clock cycle (or multiple cycles) of the scan clock signal scan_clock at the start 312 and the end 314 of the shift phase 310 or at the start 332 and the end 334 of the shift phase 330 may become longer due to the internal voltage being reduced. However, the remaining cycles in the shift phases 310 and 330 still maintain relatively shorter due to the DVFS based scan test that allows the internal voltage to remain at a higher voltage level in most of the shift phases 310 and 330.

In certain embodiments, the DVFS based scan test may be performed by an off-chip ATE, in which an automatic test pattern generation (ATPG) engine is available for determining the data to shift in, such that the shift-out response of a faulty chip would be different from the shift-out response of a good chip. A collection of such data patterns makes a test set, and the data can be shifted in from and compared in the off-chip ATE.

Figure 4:
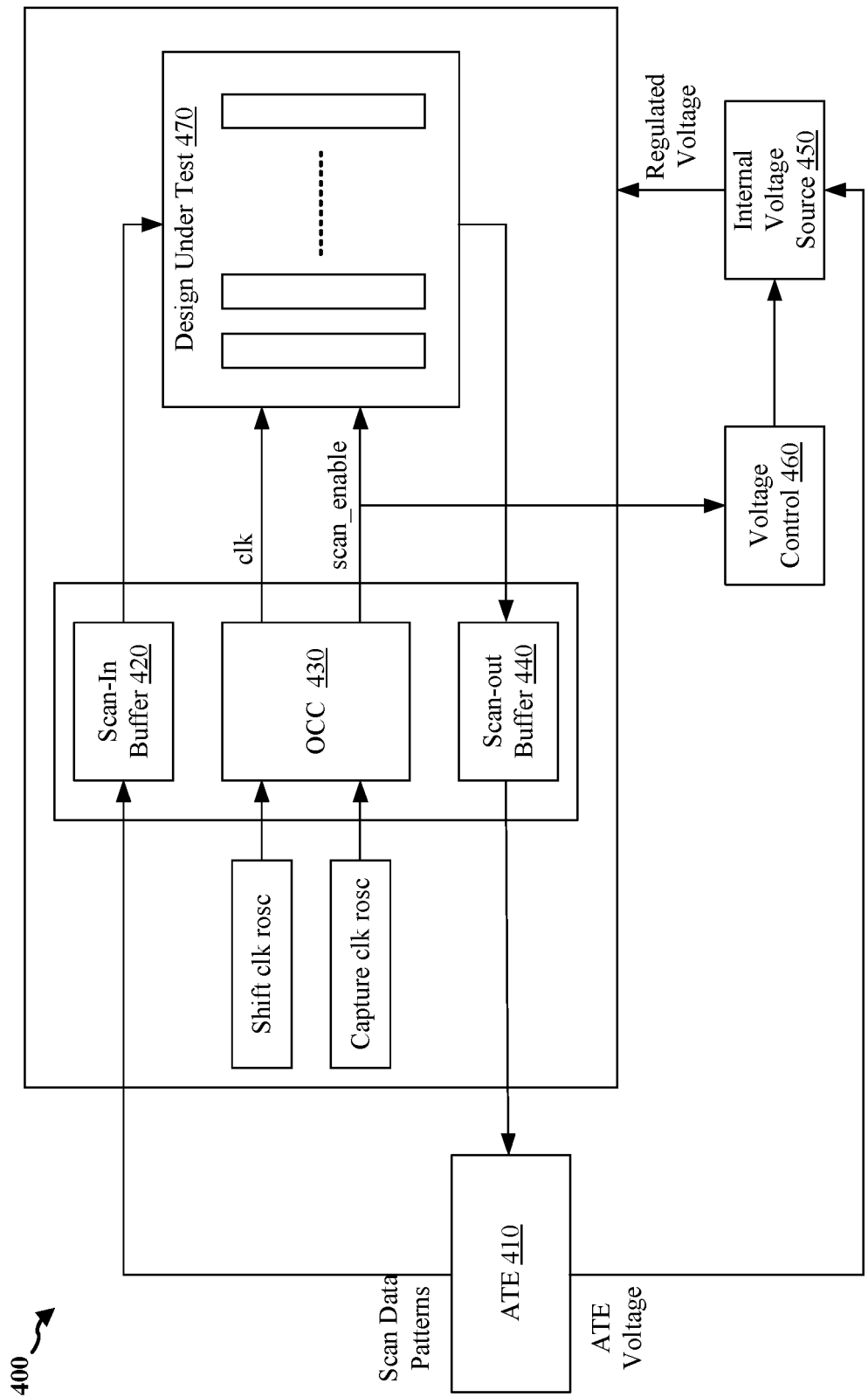
FIG. 4 is a diagram illustrating an example of the testing apparatus for performing dynamic voltage and frequency scaling for scan shift clock using an ATPG engine in the off-chip ATE.

FIG. 4 is a diagram illustrating an example of the testing apparatus for performing dynamic voltage and frequency scaling for scan shift clock using an ATPG engine in the off-chip ATE. As shown in FIG. 4, in order to perform a scan test on the DUT 470, the testing apparatus 400 utilizes the off-chip ATE 410 to provide the ATE voltage, which is a constant voltage (i.e., the constant voltage 102 as shown in FIG. 1) fixed at the high voltage level, and the scan data patterns. The DUT 470 may be a chip or other types of logic devices or electronic components. The ATE 410 also sends the scan data patterns to a scan-in buffer 420, in which the data patterns are stored to be ready to be shifted in the DUT 470. Meanwhile, an OCC 430 receives a shift clock ROSC signal and a capture clock ROSC signal to generate a scan clock signal clk, which may be similar to the scan clock signal as shown in FIG. 3, and a corresponding scan enable signal scan_enable for the DUT 470.

On the other hand, the ATE 410 sends the ATE voltage to an internal voltage source 450, which is located on the same die of the chip, to generate a regulated voltage from the ATE voltage, where the regulated voltage functions as the internal voltage for the DUT 470, thus allowing the scan test to be performed on the DUT 470 at the internal voltage. Specifically, the voltage source 450 performs the dynamic voltage and frequency scaling process on the ATE voltage (i.e., the constant voltage 102 as shown in FIG. 1) to generate the regulated voltage (i.e., the internal voltage 104 or 106 as shown in FIG. 1), such that the regulated voltage (i.e., the internal voltage) 104 or 106 is reduced to the desired lower voltage level in the capture phases 120 and 140, and maintains at the high voltage level in most of the shift phase 130. Further, a voltage control module 460 is provided to control the regulation of the voltage source 450. Specifically, the scan enable signal generated by the OCC 430, which may be similar to the scan enable signal as shown in FIG. 2, is provided as an input signal for the voltage control module 460, such that the voltage control module 460 correspondingly generates a control signal for the voltage source 450 for generating the regulated voltage (i.e., the internal voltage 104 or 106 as shown in FIG. 1) from the ATE voltage (i.e., the constant voltage 102 as shown in FIG. 1). Thus, the data patterns are shifted in from the scan-in buffer 420 to the DUT 470 under the regulated voltage (i.e., the internal voltage) provided by the voltage source 450 in the shift phase. Since the regulated voltage is maintained at the high voltage level for most of the shift phase, higher shift speeds are possible. Once the data patterns are loaded, the test response data is captured in the capture phase, and the response data is shifted out to a scan-out buffer 440, which is later forwarded to the ATE 410 to perform the comparison.

In certain embodiment, instead of using the off-chip ATE to shift in the data as shown in FIG. 4, an on-die pseudo-random test pattern generator (PRPG) may be used to shift in the data, and an on-die multiple input signature register (MISR) is used to store the response, which is later shifted out to the ATE and compared with expected good-die response on ATE.

Figure 5:
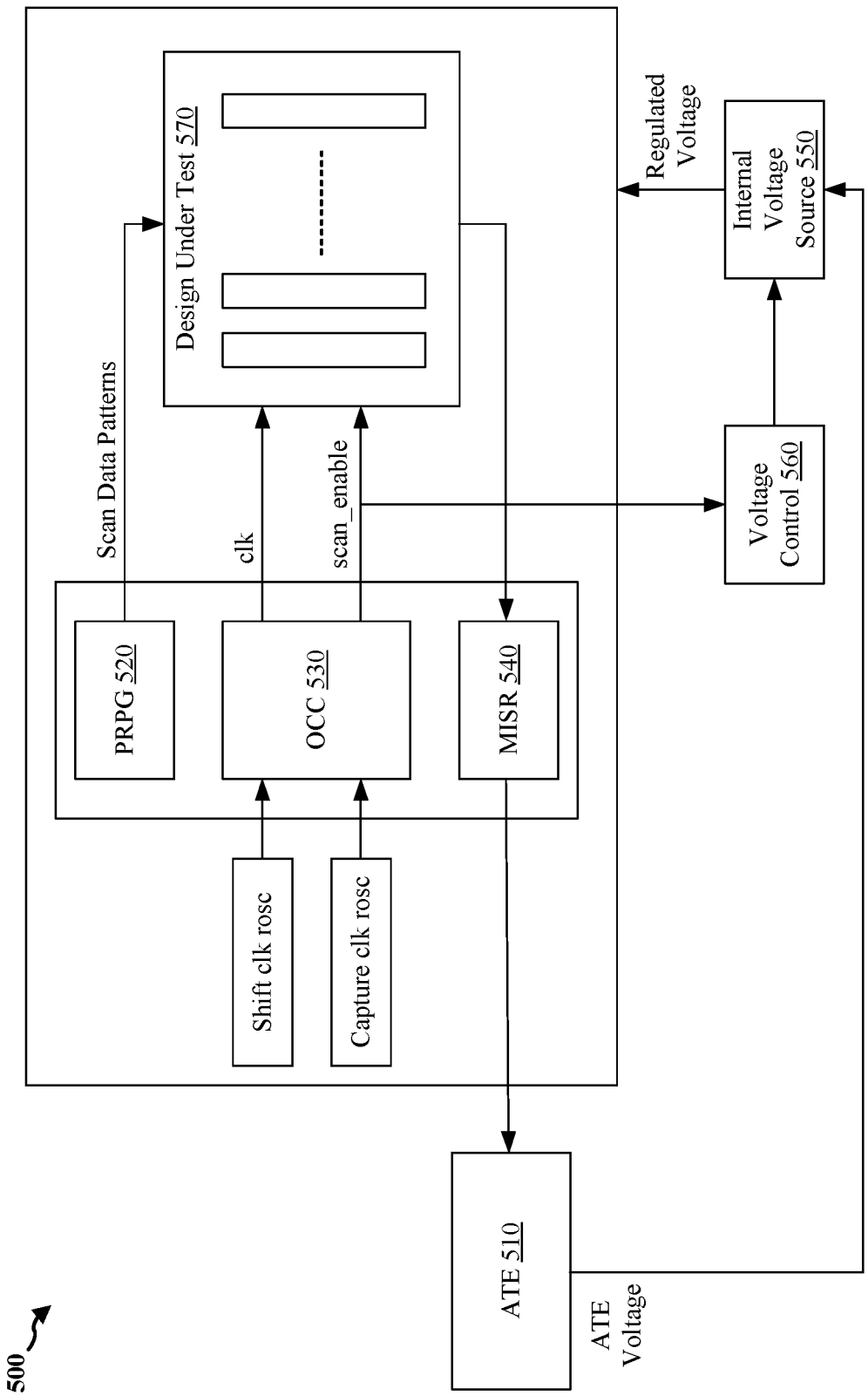
FIG. 5 is a diagram illustrating an example of the testing apparatus for performing dynamic voltage and frequency scaling for scan shift clock using an on-die PRPG and an on-die MISR.

FIG. 5 is a diagram illustrating an example of the testing apparatus for performing dynamic voltage and frequency scaling for scan shift clock using an on-die PRPG and an on-die MISR. Specifically, compared to the testing apparatus 400 as shown in FIG. 4, the testing apparatus 500 as shown in FIG. 5 has a PRPG 520 replacing the scan-in buffer 420 and a MISR 540 replacing the scan-out buffer 440. Similarly, the DUT 570 may be a chip or other types of logic devices or electronic components. As shown in FIG. 5, in order to perform a scan test on the DUT 570, the testing apparatus 500 utilizes the off-chip ATE 510 to provide only the ATE voltage, which is a constant voltage (i.e., the constant voltage 102 as shown in FIG. 1) fixed at the high voltage level. However, the data pattern for the scan test are generated by the PRPG 520 to be ready to be shifted in the DUT 570, and the ATE 510 does not need to send the scan data patterns. Meanwhile, an OCC 530 receives a shift clock ROSC signal and a capture clock ROSC signal to generate a scan clock signal clk, which may be similar to the scan clock signal as shown in FIG. 3, and a corresponding scan enable signal scan_enable for the DUT 570.

On the other hand, the ATE 510 sends the ATE voltage to an internal voltage source 550, which is located on the same die of the chip, to generate a regulated voltage based on the ATE voltage, where the regulated voltage functions as the internal voltage for the DUT 570, thus allowing the scan test to be performed on the DUT 570 at the internal voltage. Specifically, the voltage source 550 performs the dynamic voltage and frequency scaling process on the ATE voltage (i.e., the constant voltage 102 as shown in FIG. 1) to generate the regulated voltage (i.e., the internal voltage 104 or 106 as shown in FIG. 1), such that the regulated voltage (i.e., the internal voltage) 104 or 106 is reduced to the desired lower voltage level in the capture phases 120 and 140, and maintains at the high voltage level in most of the shift phase 130. Further, a voltage control module 560 is provided to control the regulation of the voltage source 550. Specifically, the scan enable signal generated by the OCC 530, which may be similar to the scan enable signal as shown in FIG. 2, is provided as an input signal for the voltage control module 560, such that the voltage control module 560 correspondingly generates a control signal for the voltage source 550 for generating the regulated voltage (i.e., the internal voltage 104 or 106 as shown in FIG. 1) from the ATE voltage (i.e., the constant voltage 102 as shown in FIG. 1). Thus, the data patterns are shifted in from the PRPG 520 to the DUT 570 under the regulated voltage (i.e., the internal voltage) provided by the voltage source 550 in the shift phase. Since the regulated voltage is maintained at the high voltage level for most of the shift phase, higher shift speeds are possible. Once the data patterns are loaded, the test response data is captured in the capture phase, and the response data is shifted out to the MISR 540, which stores the response data to be later forwarded to the ATE 510 to perform the comparison.

In the embodiments as shown in FIG. 4 and FIG. 5, two ROSCs are used in tandem for frequency variations of the shift clock signal and the functional clock (i.e., the capture clock) signal of the DUT with the internal voltage. In certain embodiments, the number of ROSCs being used may vary. For example, it is possible to use one single ROSC to generate the scan clock signal, without generating the shift clock signal and the capture clock signal respectively.

In the embodiments as shown in FIG. 4 and FIG. 5, internal on-die ROSC based clocking is used for both shift and capture clocks. The voltage source 450 or 550 performs the dynamic voltage and frequency scaling process on the ATE voltage to generate the regulated voltage (i.e., the internal voltage) 104 or 106 as shown in FIG. 1, such that the internal voltage 104 or 106 is reduced to the desired lower voltage level in the capture phases 120 and 140, and maintains at the high voltage level in most of the shift phase 130. As the internal voltage 104 or 106 is varied, the delay of the ROSC changes, which causes the output clock frequency to change accordingly, such that the scan clock signal has a frequency scaled with the internal voltage 104 or 106. It should be noted that the maximum clock frequency that the DUT can sustain varies with the internal voltage, both for the shift and capture phases. This variation is dependent on several factors such as the IR profile, the types of transistors being used, or the nature of critical paths in the design. As a result, this variation can be very different for the ROSC and the DUT. In certain embodiments, a special control circuit is designed to keep the ROSC frequency variation with the voltage mimic that of the DUT.

Using the scheme, it is possible to achieve a much higher average frequency of the scan shift clock signal. Since the test time of the scan test is primarily governed by the shift time, this results in a significant saving in the total test time. Further, the test cost is proportional to the test time, such that the overall test cost is correspondingly reduced. For example, a typical scan clock frequency is at 120 MHz when the high voltage level is used. With the DVFS based scan test approach, it is estimated that the average frequency of the scan shift clock signal may reach 200 MHz (i.e., increasing 80 MHz), which would lead to 40% of the scan shift time reduction. Since the scan test occupies roughly 15% of the overall test time, about 6% reduction can be achieved in the total test time. Also, different operating voltages can be tested without altering the fixed ATE voltage supply, which further reduces the overall scan test time.

In certain embodiments, as the shift speed is increased, it may be required to implement the existing logic built-in self-test (LBIST) and/or Q-gating technology to remove the scan shift speed bottleneck.

Figure 6:
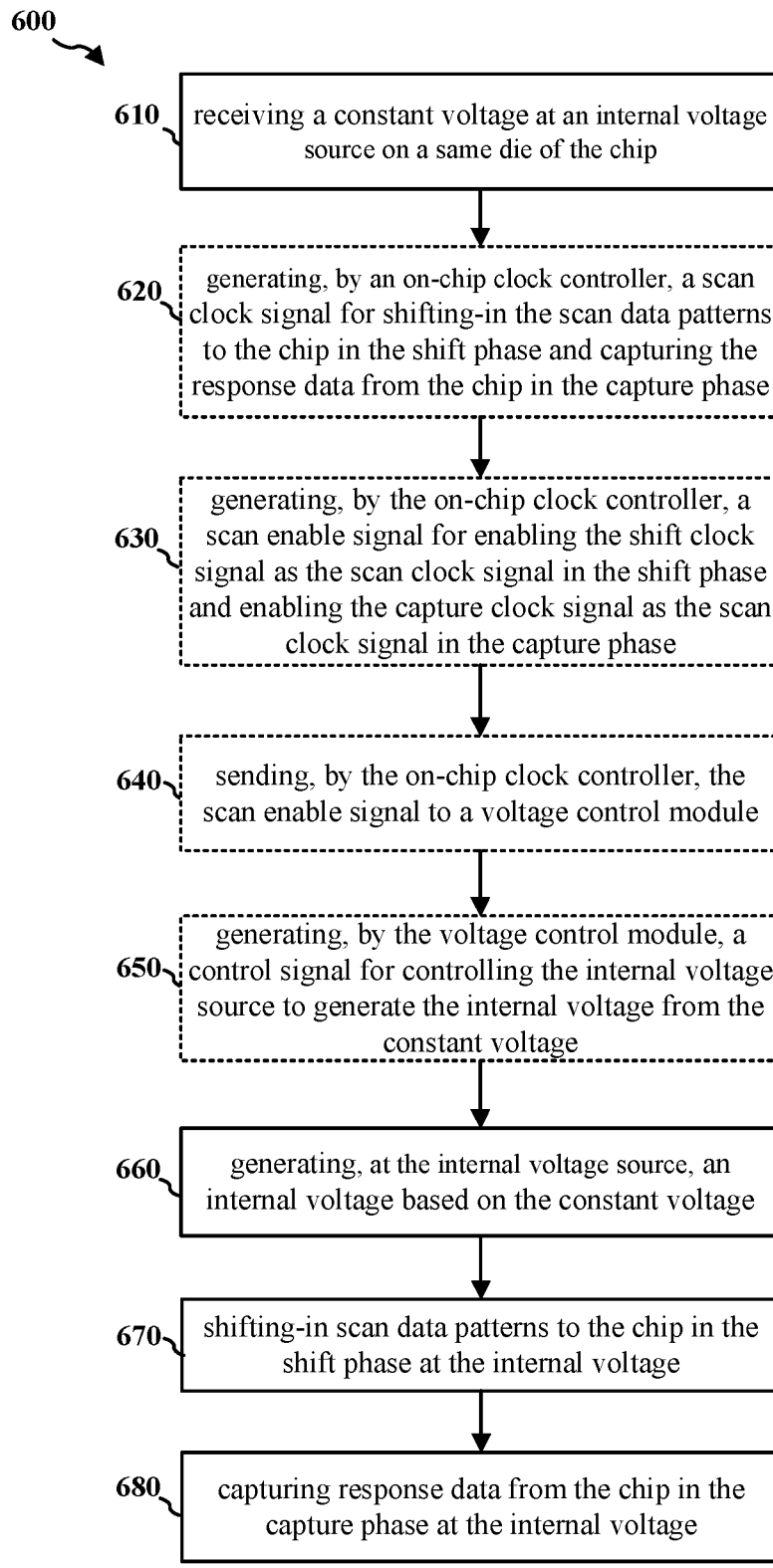
FIG. 6 is a flow chart of a method (process) for performing a scan test on a chip.

FIG. 6 is a flow chart of a method (process) for performing a scan test on a chip. The method may be performed by an apparatus having the on-die internal voltage source (e.g., the internal voltage source 450 or 550), which is on a same die of the chip. At operation 610, the apparatus receives a constant voltage at the internal voltage source. Optionally, at operation 620, the apparatus generates, by an on-chip clock controller, a scan clock signal for shifting-in the scan data patterns to the chip in the shift phase and capturing the response data from the chip in the capture phase. A frequency of the scan clock signal at the start and the end of the shift phase is adjusted to be scaled with the internal voltage. Optionally, at operation 630, the apparatus generates, by the on-chip clock controller, a scan enable signal for enabling the shift clock signal as the scan clock signal in the shift phase and enabling the capture clock signal as the scan clock signal in the capture phase. Optionally, at operation 640, the apparatus sends, by the on-chip clock controller, the scan enable signal to a voltage control module. Optionally, at operation 650, the apparatus generates, by the voltage control module, a control signal for controlling the internal voltage source to generate the internal voltage from the constant voltage. At operation 660, the apparatus generates, at the internal voltage source, an internal voltage based on the constant voltage. The internal voltage is maintained at a lower voltage level in a capture phase of the scan test, and is increased from the lower voltage level to a high voltage level at a start of a shift phase of the scan test and reduced from the high voltage level to the lower voltage level at an end of the shift phase. At operation 670, the apparatus shifts-in scan data patterns to the chip in the shift phase at the internal voltage. At operation 680, the apparatus captures response data from the chip in the capture phase at the internal voltage.

In certain configurations, the apparatus further includes an on-die shift ROSC and an on-die capture ROSC. The on-die shift ROSC generates a shift clock signal and to adjust a frequency of the shift clock signal to be scaled with the internal voltage. The on-die capture ROSC generates a capture clock signal. The on-chip clock controller generates the scan clock signal from the shift clock signal and the capture clock signal.

In certain configurations, the scan data patterns are shifted-in to the chip in the shift phase by a scan-in buffer, and the response data captured from the chip in the capture phase is shifted-out and stored in a scan-out buffer.

In certain configurations, the scan data patterns are shifted-in to the chip in the shift phase by an on-die PRPG, and the response data captured from the chip in the capture phase is shifted-out and stored in an on-die MISR.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of performing a scan test on a chip, comprising:
   receiving a constant voltage at an internal voltage source on a same die of the chip;
   generating, at the internal voltage source, an internal voltage from the constant voltage, wherein the internal voltage is maintained at a lower voltage level in a capture phase of the scan test, and is increased from the lower voltage level to a high voltage level at a start of a shift phase of the scan test and reduced from the high voltage level to the lower voltage level at an end of the shift phase;
   generating a scan clock signal for shifting-in scan data patterns to the chip in the shift phase and capturing response data from the chip in the capture phase;
   shifting-in scan data patterns to the chip in the shift phase at the internal voltage; and
   capturing response data from the chip in the capture phase at the internal voltage, wherein a frequency of the scan clock signal is adjusted to be scaled with the internal voltage such that the frequency of the scan clock signal is increased during the shift phase according to the increase in the internal voltage from the lower voltage level to the higher voltage level.

2. The method of claim 1, wherein the internal voltage source is an on-die internal low drop-out (iLDO) voltage regulator.

3. The method of claim 1, wherein the scan clock signal is generated by an on-chip clock controller.

4. The method of claim 3, wherein the scan clock signal is generated by the on-chip clock controller from a shift clock signal generated by an on-die shift ring oscillator (ROSC) and a capture clock signal generated by an on-die capture ROSC, and a frequency of the shift clock signal is adjusted by the on-die shift ROSC to be scaled with the internal voltage.

5. The method of claim 3, further comprising:
   generating, by the on-chip clock controller, a scan enable signal for enabling the shift clock signal as the scan clock signal in the shift phase and enabling the capture clock signal as the scan clock signal in the capture phase;
   sending, by the on-chip clock controller, the scan enable signal to a voltage control module; and
   generating, by the voltage control module, a control signal for controlling the internal voltage source to generate the internal voltage from the constant voltage.

6. The method of claim 1, wherein the scan data patterns are shifted-in to the chip in the shift phase by a scan-in buffer, and the response data captured from the chip in the capture phase is shifted-out and stored in a scan-out buffer.

7. The method of claim 1, wherein the scan data patterns are shifted-in to the chip in the shift phase by an on-die pseudo-random test pattern generator (PRPG), and the response data captured from the chip in the capture phase is shifted-out and stored in an on-die multiple input signature register (MISR).

8. An apparatus for performing a scan test on a chip, comprising:
   an internal voltage source on a same die of the chip, configured to:

receive a constant voltage, and generate an internal voltage based on the constant voltage, wherein the internal voltage is maintained at a lower voltage level in a capture phase of the scan test, and is increased from the lower voltage level to a high voltage level at a start of a shift phase of the scan test and reduced from the high voltage level to the lower voltage level at an end of the shift phase; and an on-chip clock controller, configured to;

generate a scan clock signal for shifting-in scan data patterns to the chip in the shift phase and capturing response data from the chip in the capture phase;

shift-in scan data patterns to the chip in the shift phase at the internal voltage; and capture response data from the chip in the capture phase at the internal voltage, wherein a frequency of the scan clock signal is adjusted to be scaled with the internal voltage such that the frequency of the scan clock signal is increased during the shift phase according to the increase in the internal voltage from the lower voltage level to the higher voltage level.

9. The apparatus of claim 8, wherein the internal voltage source is an on-die internal low drop-out (iLDO) voltage regulator.

10. The apparatus of claim 8, further comprising:

an on-die shift ring oscillator (ROSC), configured to generate a shift clock signal and to adjust a frequency of the shift clock signal to be scaled with the internal voltage, and an on-die capture ROSC, configured to generate a capture clock signal, wherein the on-chip clock controller is configured to generate the scan clock signal from the shift clock signal and the capture clock signal.

11. The apparatus of claim 8, further comprising:

a voltage control module, configured to receive a scan enable signal from the on-chip clock controller and to generate a control signal for controlling the internal voltage source to generate the internal voltage from the constant voltage, wherein the on-chip clock controller is configured to generate the scan enable signal for enabling the shift clock signal as the scan clock signal in the shift phase and enabling the capture clock signal as the scan clock signal in the capture phase.

12. The apparatus of claim 8, further comprising:

a scan-in buffer, configured to shift-in scan data patterns to the chip in the shift phase; and a scan-out buffer, configured to store response data captured and shifted-out from the chip in the capture phase.

13. The apparatus of claim 8, further comprising:

an on-die pseudo-random test pattern generator (PRPG), configured to shift-in scan data patterns to the chip in the shift phase; and an on-die multiple input signature register (MISR), configured to store response data captured and shifted-out from the chip in the capture phase.

14. A non-transitory computer-readable medium storing computer executable code for performing a scan test on a chip, comprising code to:

receive a constant voltage at an internal voltage source on a same die of the chip;

generate, at the internal voltage source, an internal voltage from the constant voltage, wherein the internal voltage is maintained at a lower voltage level in a capture phase of the scan test, and is increased from the lower voltage level to a high voltage level at a start of a shift phase of the scan test and reduced from the high voltage level to the lower voltage level at an end of the shift phase;

generate a scan clock signal for shifting-in scan data patterns to the chip in the shift phase and capturing response data from the chip in the capture phase;

shift-in scan data patterns to the chip in the shift phase at the internal voltage; and capture response data from the chip in the capture phase at the internal voltage, wherein a frequency of the scan clock signal is adjusted to be scaled with the internal voltage such that the frequency of the scan clock signal is increased during the shift phase according to the increase in the internal voltage from the lower voltage level to the higher voltage level.

15. The non-transitory computer-readable medium of claim 14, wherein the scan clock signal is generated by an on-chip clock controller.

16. The non-transitory computer-readable medium of claim 15, wherein the scan clock signal is generated by the on-chip clock controller from a shift clock signal generated by an on-die shift ring oscillator (ROSC) and a capture clock signal generated by an on-die capture ROSC, and a frequency of the shift clock signal is adjusted by the on-die shift ROSC to be scaled with the internal voltage.

17. The non-transitory computer-readable medium of claim 15, further comprising code to:

generate, by the on-chip clock controller, a scan enable signal for enabling the shift clock signal as the scan clock signal in the shift phase and enabling the capture clock signal as the scan clock signal in the capture phase;

send, by the on-chip clock controller, the scan enable signal to a voltage control module; and generate, by the voltage control module, a control signal for controlling the internal voltage source to generate the internal voltage from the constant voltage.

* * * * *